United States Patent
Porter et al.

[11] Patent Number: 5,923,176
[45] Date of Patent: Jul. 13, 1999

[54] HIGH SPEED TEST FIXTURE

[75] Inventors: Warren W. Porter, Escondido; Ikuo J. Sanwo, San Marcos, both of Calif.

[73] Assignee: NCR Corporation, Dayton, Ohio

[21] Appl. No.: 07/747,074

[22] Filed: Aug. 19, 1991

[51] Int. Cl.⁶ .................................................. G01R 1/073
[52] U.S. Cl. ........................................... 324/754; 324/761
[58] Field of Search ................................. 324/158 F, 754, 324/761; 439/68, 70, 72, 69, 79, 75, 64, 362, 364, 78, 81, 85, 359

[56] References Cited

U.S. PATENT DOCUMENTS

| | | | |
|---|---|---|---|
| 3,022,362 | 2/1962 | O'Brien | 439/359 |
| 3,393,396 | 7/1968 | Majewski | 439/364 |
| 3,495,131 | 2/1970 | Melcher | 439/68 |
| 3,848,953 | 11/1974 | Petroshanoff | 439/362 |
| 4,352,061 | 9/1982 | Matrone | 324/158 F |
| 4,516,072 | 5/1985 | Marpoe, Jr. | 324/158 F |
| 4,544,886 | 10/1985 | Murray | 324/158 F |
| 4,564,251 | 1/1986 | Hansen et al. | 439/364 |
| 4,627,759 | 12/1986 | Kato et al. | 439/364 |
| 4,700,132 | 10/1987 | Yarbrough et al. | 324/158 F |
| 4,912,401 | 3/1990 | Nady, II et al. | 324/158 F |
| 4,931,679 | 6/1990 | Fournier | 439/78 |
| 5,150,041 | 9/1992 | Eastin et al. | 324/158 F |

FOREIGN PATENT DOCUMENTS

| | | | |
|---|---|---|---|
| 129188 | 11/1945 | Australia | 439/359 |
| 0148436 | 11/1980 | Japan | 324/158 F |
| 0083966 | 4/1986 | Japan | 324/158 F |
| 0162758 | 7/1986 | Japan | 324/158 F |
| 2-51078 | 2/1990 | Japan | 324/158 P |

OTHER PUBLICATIONS

"Bendix Centre Connector", by Bendix, cl. 439/362 Mar. 1966.
"Electrical Plug Jack Housing", by Garland IBM Tech. Disc. Bull., vol. 9, #10, Mar. 1967, pp. 1280–1281, cl. 439–364.
"Test Socket", by Ross, IBM, Tech. Disc. Bull., vol. 10, #5, Oct. 1967, pp. 549–550.
"Testing Apparatus with Selectable Probes . . . " by Fause et al, IBM Tech. Disc. Bull., vol. 20, #9, Feb. 1978, pp. 3461–3462, cl. 324/158 P.
"Joining D/P Modules to Printed Circuit Cards", by Morgan et al, IBM Tech Disc. Bull., vol. 11 #7, Dec. 1968, pp. 736–737, cl. 324/158 F.
"New ATE jig and Fixture Developments, Electronic Engineering" (by Factron), vol. 59, p. 16, #729, Sep. 1987, cl. 324–158 F.

*Primary Examiner*—Ernest F. Karlsen
*Attorney, Agent, or Firm*—Gregory A. Welte

[57] ABSTRACT

A high speed test fixture for testing printed circuit board (PCB)-mounted high speed pin grid array (PGA) chips attaches to the solder side (underside) of the PCB to eliminate the need for lead-lengthening adapter sockets. As a result, the testing can be conducted at the actual chip operating speed with reduced noise, rather than at slower speeds required by "noisy" prior art approaches.

4 Claims, 3 Drawing Sheets

HIGH SPEED TEST FIXTURE

FIELD OF THE INVENTION

The present invention generally relates to equipment for testing the operability of integrated circuit (IC) chips, particularly those of the pin grid array (PGA) type.

BACKGROUND OF THE INVENTION

An important step in the development of computer systems is testing the IC chips of a particular system to determine if there are "bugs" in the design or implementation. In typical testing schemes, some or all of the pins on the IC chip are connected to leads of test equipment such as a logic analyzer, and then the circuit including the chip(s) under test is operated and observed.

In typical computer systems, the chips are inserted in a permanent socket, which is connected to a system board of the printed circuit variety. During testing, however, a special adapter socket is interposed between the chip under test and the permanent socket. The adapter socket feeds the leads of the the test equipment. The chips under test are thus tested from the component side of the system board because of the relative location of the adapter sockets.

In the test of high speed chips, use of the adapter socket often increases socket lead lengths to a point where power consumption and signal path inductances, and hence noise levels, become unacceptably high. To reduce the noise to an acceptable level, the operating speed must be reduced by lowering the system clock frequency. However, the chips will not have been tested at the actual (higher) operating speeds. As a result, high speed-related bugs may not be detected until later in the implementation of a design, when they are more difficult to remove.

SUMMARY OF THE INVENTION

Thus, it is a first object of the present invention to test chips at their actual operating speeds rather than at reduced speeds.

It is a second object of the present invention to solder the chips directly to the system board to reduce lead lengths, and hence improve system performance.

It is a third object of the present invention to reduce production costs by eliminating the need for an adapter socket.

There is provided in accordance with the present invention, an arrangement for high-speed testing of board-mounted IC chips including:

- an IC chip mounted on a first side of a printed circuit board (PCB) having pins of the IC chip protruding from a second side of the PCB; and
- a test fixture connected to the protruding pins and to the second side of the PCB, for providing electrical paths between the protruding pins and test equipment connected to the test fixture.

The details of the present invention will be revealed in the following description with reference to the drawing figures.

DESCRIPTION OF THE PREFERRED EMBODIMENT

Figure 1:
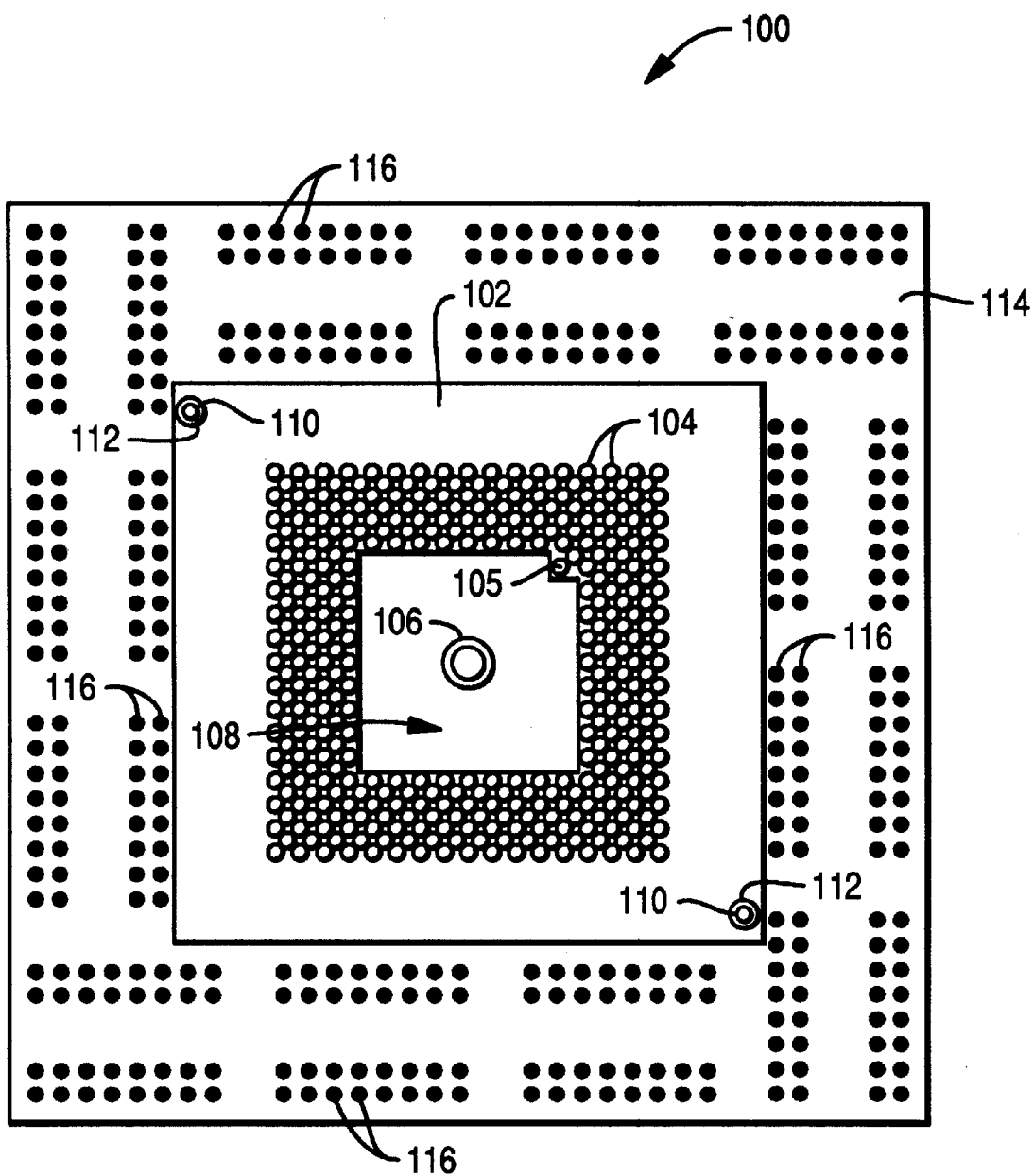
FIG. 1 is a bottom view of the high speed test fixture of the present invention.
Figure 2:
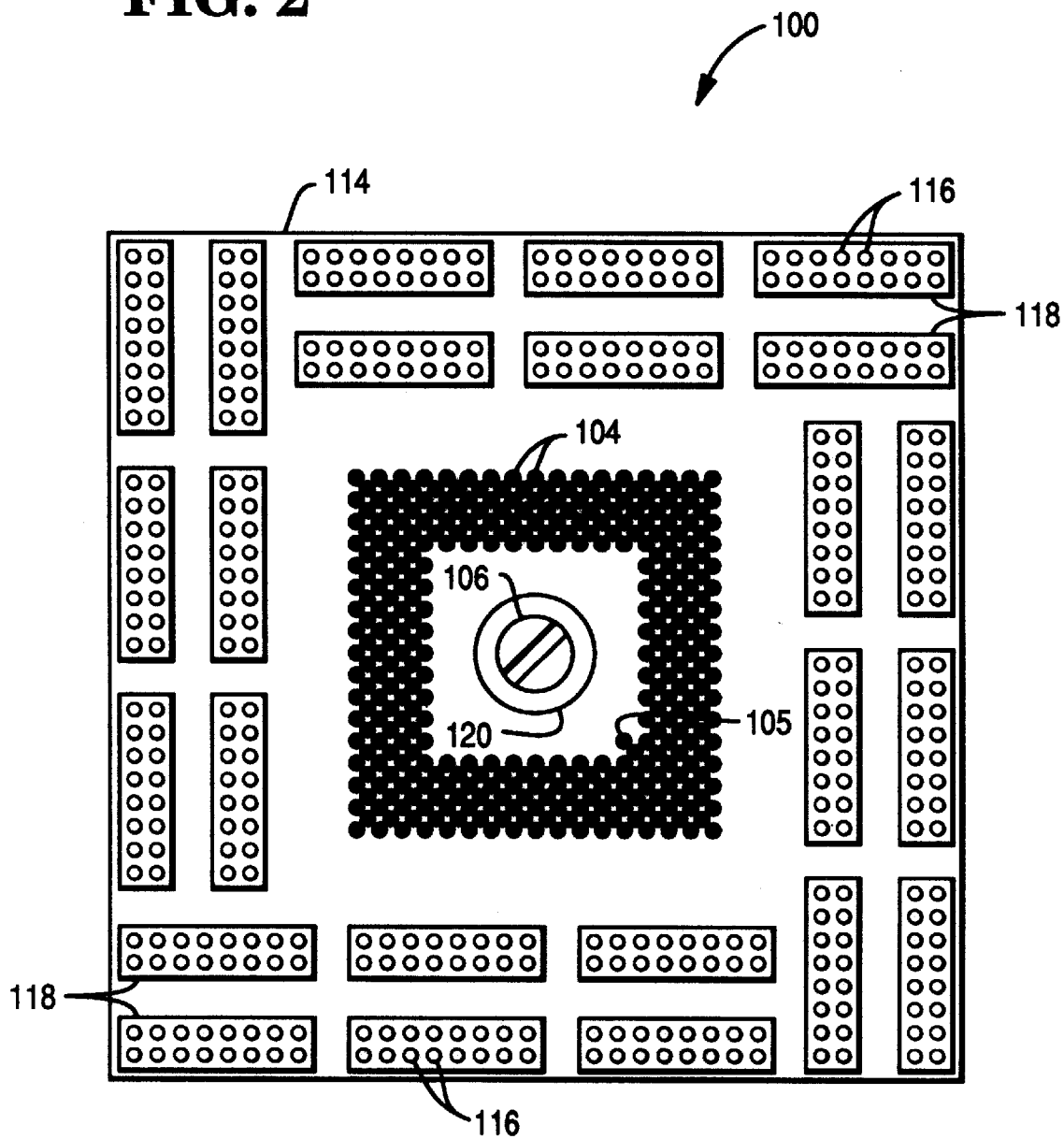
FIG. 2 is a top view of the high speed test fixture of the present invention.

The high speed test fixture 100 shown in FIG. 1 meets the objects of the present invention. Shown from the bottom, the test fixture 100 has a test fixture body 102 made of a suitable plastic in the preferred embodiment, which contains a number of holes that tightly accept spring-loaded pogo pins or spring pins 104. The spring pins are for biasly making direct contact with the pins of a PGA chip, to be illustrated infra. A jack screw 106, extending out of the plane, is mounted in a jack screw clearance hole 120 (best seen in FIG. 2). The jack screw 106 is used to secure the test fixture 100 to the underside of a system PCB 402, shown in FIG. 4.

A recess 108, surrounded by the spring pins 104 serves as a clearance for components attached to the underside of the system PCB 402, such as decoupling capacitors. Also, the test fixture 100 has two guide pins 110 which fit into guide pin holes in the system PCB 402 when the test fixture and system PCB are securely mated. The guide pins and guide holes serve to properly align the spring pins 104 with the pins of the PGA chip. The guide pins 110 have stops 112 at their bases. The stops have a larger diameter than the guide pin holes to provide a minimum clearance between the test fixture 100 and the system PCB 402. This prevents undue pressure on the PGA pins from the spring pins when the test fixture 100 is secured to the system PCB. Also shown is an orientation or coding pin 105, which will allow only one-way coupling of the spring pins 104 to the pins of the chip under test, in a manner well known in the art.

The top view of the test fixture 100 shows a test fixture PCB 114 which carries several connector bodies 118. The connector bodies 118 each contain several connector pins 116 which can be connected directly to test equipment such as a logic analyzer (not shown in the Figure). The spring pins 104 are soldered to the PCB 114.

Figure 3:
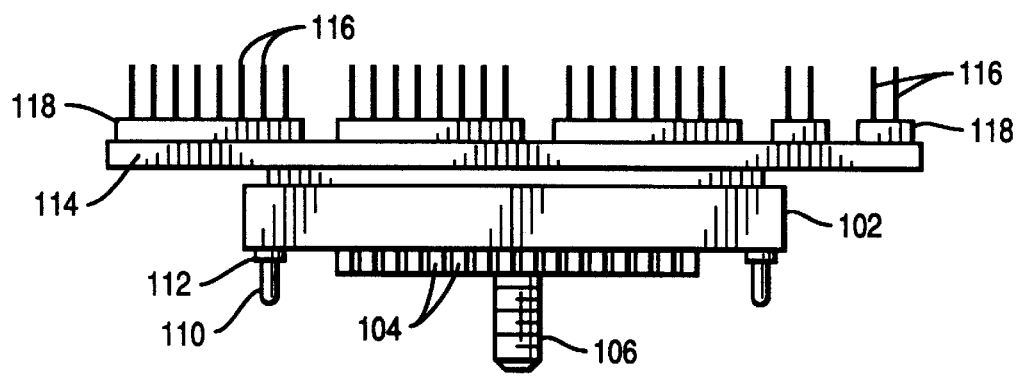
FIG. 3 is a side view of the high speed test fixture of the present invention.

The side view of test fixture 100 shown in FIG. 3 further illustrates the configuration of the preferred embodiment of the present invention.

Figure 4:
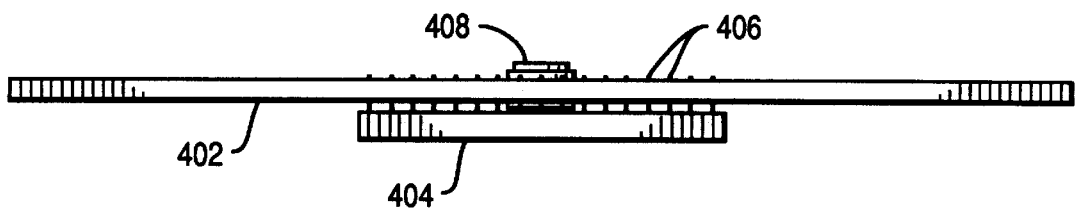
FIG. 4 is a side view of the chip to be tested, the system PCB, and the high speed test fixture fastener.

Turning now to FIG. 4, the system PCB 402 has a very large scale integration (VLSI) PGA chip 404 soldered thereto in a known manner such that the PGA pins uniformly protrude the system PCB 402 on the solder side. A captive fastener 408 is secured to the system PCB 402, and is a matable sleeve for the jack screw 106.

Figure 5:
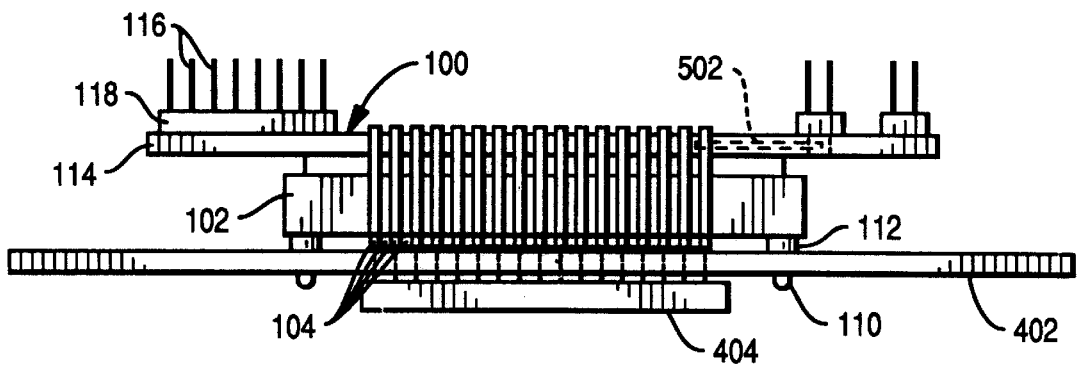
FIG. 5 is a side view of the high speed test fixture, the the PCB and the test chip.

In FIG. 5, the test fixture 100 is shown fully connected to the system PCB 402, and hence the PGA pins 406. This is accomplished by first inserting the jack screw 106 in the jack screw clearance hole 120, while contemporaneously inserting the guide pins 110 in their corresponding guide pin holes. The head of the jack screw is turned to pull the components toward each other until the stops 112 rest on the system PCB 402. An etched conductor 502 internal to the test fixture PCB 114 provides electrical continuity between the spring pins 104 and the connector pins 116.

As may be intuitively obvious, removal of the test fixture 100 from contact with the PGA pins 406 and the system PCB 402 is effected by turning the head of the jack screw 106 (in the opposite direction used to secure the aforementioned components) until the jack screw disengages from the captive fastener 408.

Variations and modifications to the present invention are possible given the above disclosure. However, such variations and modifications are intended to be within the scope of the invention claimed by this letters patent.

We claim:

1. An arrangement for high-speed testing of a board-mounted integrated circuit (IC) chip, said IC chip being mounted on a first side of a printed circuit board (PCB) and having pins of said IC protruding from a second side of said PCB, said arrangement comprising:

a test fixture coupled, by means of spring-loaded test pins, to said protruding pins and to the second side of said PCB, for providing electrical paths between said protruding pins and test equipment coupled to said test fixture;

a securing screw; and a securing screw sleeve;

wherein the rotation of said securing screw in said securing screw sleeve serves to couple said test fixture to said protruding pins and to the second side of said PCB.

2. A system for making electrical contact with the pins of an integrated circuit (IC) having IC pins (406) extending through a printed circuit board (PCB), comprising:

a) a test fixture (100);

b) spring-loaded pins (104), supported by the test fixture (100), for making contact with respective IC pins (406);

c) a threaded sleeve (408), captive on the PCB;

d) a jacking screw, connected to the test fixture (100), for mating with the threaded sleeve (408) and drawing the spring-loaded pins (104) into engagement with the IC pins (406);

e) output pins (116), supported by the test fixture (100), for connecting to test equipment; and f) conductors (502) extending between the spring-loaded pins (104) and respective output pins (116).

3. For an integrated circuit (404), located on one side of a printed circuit board (PCB) (402), and having connector pins (406) which are accessible from the other side of the PCB, a connection system comprising:

a) a test connector which includes a plurality of spring-loaded pins (104), each for engaging a respective connector pin (406);

b) a threaded sleeve (408) on the PCB; and c) a jacking screw (106) on the test connector, for mating with the threaded sleeve, for drawing the spring-loaded pins into engagement with the connector pins.

4. In a printed circuit board (PCB) bearing an integrated circuit (IC) whose connector pins extend through the PCB, the improvement comprising:

a) a threaded sleeve on the PCB, located approximately at the center of the IC, for receiving a threaded screw on a test connector, for drawing the test connector toward the IC.

* * * * *